(12) United States Patent
Yang et al.

(10) Patent No.: US 9,245,962 B1
(45) Date of Patent: Jan. 26, 2016

(54) METHOD OF MANUFACTURING SEMICONDUCTOR DEVICE

(71) Applicant: SK hynix Inc., Gyeonggi-do (KR)

(72) Inventors: Ki Hong Yang, Gyeonggi-do (KR); Dong Sun Sheen, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/600,985

(22) Filed: Jan. 20, 2015

(30) Foreign Application Priority Data

Aug. 28, 2014 (KR) .......................... 10-2014-0113236

(51) Int. Cl.
  *H01L 21/336* (2006.01)
  *H01L 29/423* (2006.01)
  *H01L 27/115* (2006.01)
  *H01L 29/66* (2006.01)
  *H01L 27/105* (2006.01)

(52) U.S. Cl.
  CPC ...... *H01L 29/42344* (2013.01); *H01L 27/1052* (2013.01); *H01L 27/1157* (2013.01); *H01L 27/11578* (2013.01); *H01L 29/66833* (2013.01)

(58) Field of Classification Search
  None
  See application file for complete search history.

(56) References Cited

U.S. PATENT DOCUMENTS

| 2011/0065270 A1* | 3/2011 | Shim ................. H01L 27/11556 438/589 |
| 2012/0049268 A1* | 3/2012 | Chang ............... H01L 21/28273 257/324 |
| 2012/0068255 A1* | 3/2012 | Lee ..................... H01L 29/7926 257/324 |
| 2012/0199897 A1* | 8/2012 | Chang ................. H01L 21/8221 257/314 |
| 2012/0205722 A1* | 8/2012 | Lee ..................... H01L 27/1157 257/211 |

FOREIGN PATENT DOCUMENTS

| KR | 101263182 | 5/2013 |
| KR | 1020140048653 | 4/2014 |
| KR | 1020150067811 | 6/2015 |

* cited by examiner

*Primary Examiner* — Benjamin Sandvik
*Assistant Examiner* — Herve Assouman
(74) *Attorney, Agent, or Firm* — IP & T Group LLP

(57) ABSTRACT

A method of manufacturing a semiconductor device includes forming a sacrificial pattern, forming a first stacked structure including first material layers and second material layers alternately stacked on the sacrificial pattern, forming first semiconductor patterns passing through the first stacked structure and dielectric multi-layers surrounding the first semiconductor patterns, forming a slit passing through the first stacked structure and exposing the sacrificial pattern, forming a spacer on an inner wall of the slit, forming a first opening by removing the sacrificial pattern through the slit, forming a second opening by partially removing the dielectric multi-layers through the first opening to expose lower portions of the first semiconductor patterns, and forming a connection pattern in contact with the first semiconductor patterns in the first and second openings.

22 Claims, 20 Drawing Sheets

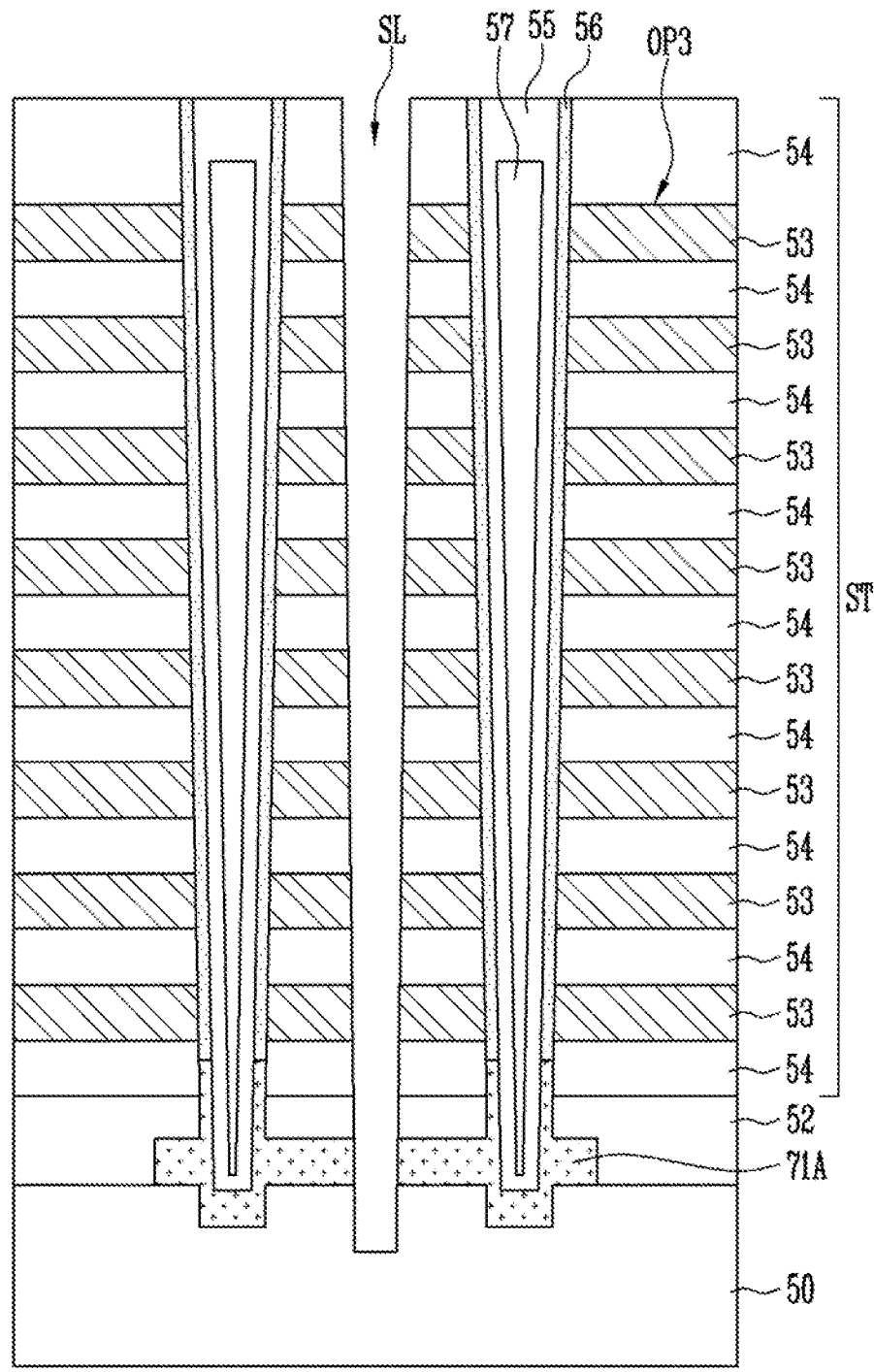

METHOD OF MANUFACTURING SEMICONDUCTOR DEVICE

CROSS-REFERENCE TO RELATED APPLICATION

The present application claims priority to Korean Patent Application Number 10-2014-0113236, filed on Aug. 28, 2014, the entire disclosure of which is herein incorporated by reference in its entirety.

BACKGROUND

1. Field of Invention

Embodiments relate to a method of manufacturing an electronic device. More specifically, embodiments relate to a method of manufacturing a three-dimensional semiconductor device.

2. Description of Related Art

Nonvolatile memory devices are memory devices in which data stored therein is maintained even when a power supply is interrupted. Recently, due to an increase in the degree of integration, two-dimensional memory devices in which memory cells are formed in a single layer on a silicon substrate, are reaching physical limits, and three-dimensional nonvolatile memory devices in which memory cells are vertically stacked on a silicon substrate have been proposed.

In the three-dimensional memory devices, a stacked structure is formed by alternately stacking conductive layers and insulating layers, and a channel layer passing through the stacked structure is formed. Accordingly, a plurality of memory cells may be formed at the same time. In particular, memory strings are arranged in a U shape to improve the degree of integration of a memory device.

However, as the height of the stacked structure increases, difficulties in performing an etch process may increase. In addition, when the memory strings are arranged in the U shape, cell currents may decrease since a channel length increases. Furthermore, during a program or erase operation, operation characteristics may be degraded since currents which flow through the channel are not sufficient.

SUMMARY

Embodiments of the present invention are directed to a method of manufacturing a semiconductor device, which simplifies a manufacture process and improves device characteristics.

According to an aspect of the embodiments, there is provided a method of manufacturing a semiconductor device including forming a sacrificial pattern, forming a first stacked structure including first material layers and second material layers alternately stacked on the sacrificial pattern, forming first semiconductor patterns passing through the first stacked structure and dielectric multi-layers surrounding the first semiconductor patterns, forming a slit passing through the first stacked structure and exposing the sacrificial pattern, forming a spacer on an inner wall of the slit, forming a first opening by removing the sacrificial pattern through the slit, forming a second opening by partially removing the dielectric multi-layers through the first opening to expose lower portions of the first semiconductor patterns, and forming a connection pattern in contact with the first semiconductor patterns in the first and second openings.

BRIEF DESCRIPTION OF THE DRAWINGS

Embodiments will become more apparent with reference to the accompanying drawings, in which:

FIGS. 7A and 7B are cross-sectional views for describing a method of forming a connection pattern according to an embodiment;

DETAILED DESCRIPTION

Exemplary embodiments will be described in detail below with reference to the accompanying drawings. The embodiments may, however, be modified in different forms and should not be construed as limiting.

Figure 1A:
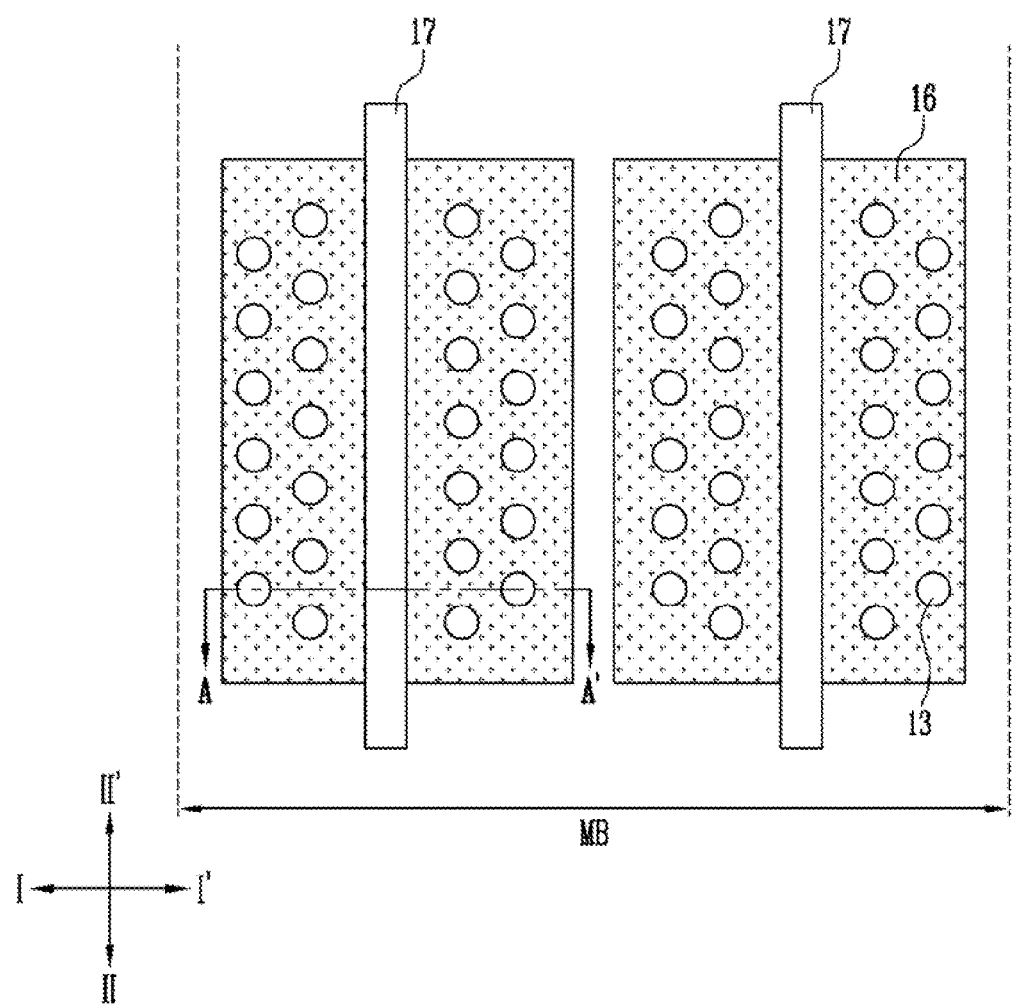
FIG. 1A is a layout of a semiconductor device according to an embodiment.
Figure 1B:
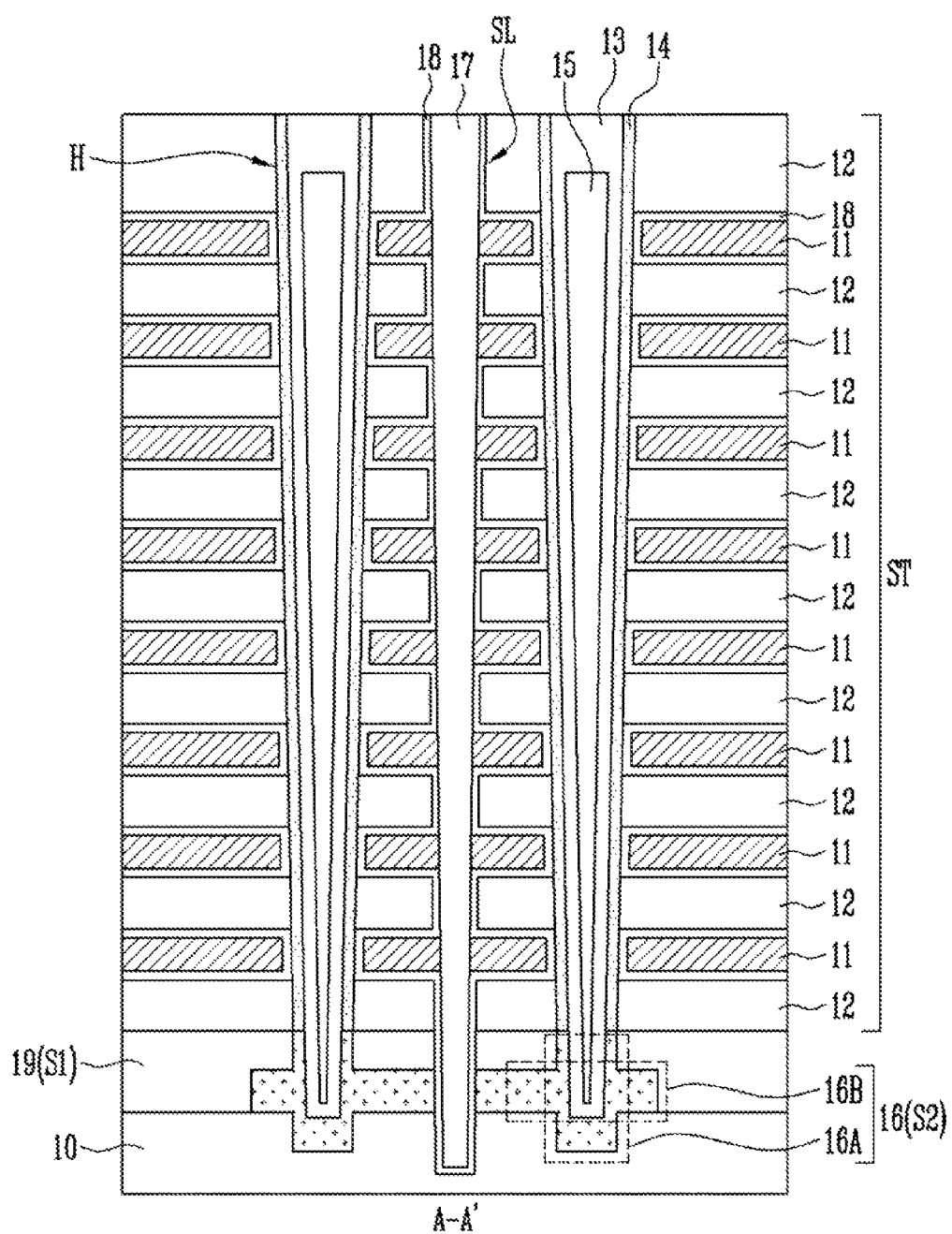
FIG. 1B is a cross-sectional view taken along line A-A' of FIG. 1A.

FIGS. 1A and 1B illustrate a structure of a semiconductor device according to an embodiment. FIG. 1A is a layout, and FIG. 1B is a cross-sectional view taken along line A-A' of FIG. 1A.

As illustrated in FIGS. 1A and 1B, a semiconductor device according to an embodiment may include a substrate 10, a first conductive layer 19 disposed on the substrate 10, a stacked structure ST formed on the first conductive layer 19, semiconductor patterns 13 passing through the stacked structure ST, and a connection pattern 16 connecting the semiconductor patterns 13 to each other.

The first conductive layer 19 may be a first source layer S1 connected to vertical memory strings. Here, the first conductive layer 19 may include polysilicon, a metal, and the like. In an embodiment, the first conductive layer 19 is a polysilicon layer, and formed to surround an upper surface and a sidewall of the connection pattern 16. In another embodiment, the first conductive layer 19 may be formed to fully surround the connection pattern 16 up to a lower surface of the connection pattern 16.

The stacked structure ST may include second conductive layers 11 and insulating layers 12 which are alternately stacked. The second conductive layers 11 are gate electrodes of transistors. For example, at least one lowermost second conductive layer 11 among the second conductive layers 11 is a gate electrode of a lower select transistor. At least one uppermost second conductive layer 11 among the second conductive layers 11 is a gate electrode of an upper select transistor. The remaining second conductive layers 11 are gate electrodes of memory cells. In addition, the second conductive layers 11 may include a polysilicon layer, tungsten, and the like. The insulating layers 12 electrically separate the stacked gate electrodes from each other, and may include an oxide layer. According to the structure, at least one lower select transistor, a plurality of memory cells, and at least one upper select transistor are sequentially stacked and may configure a vertical memory string.

The semiconductor patterns 13 may be channel layers of a select transistor, memory cells, and the like. Referring to FIG. 1A, the semiconductor patterns 13 may be arranged in a first direction I-I' and a second direction II-II' intersecting the first direction I-I'. For example, the semiconductor patterns 13 may be arranged in a matrix form, or arranged in a staggered manner. In addition, each of the semiconductor patterns 13 may include an opening in its center portion. When each of the semiconductor patterns 13 includes the opening in its center portion, insulating layers 15 may fill the opening in the center portions of the semiconductor patterns 13.

The semiconductor patterns 13 may be formed in holes H. Here, the holes H may be formed to pass through the stacked structure ST, the first conductive layer 19, and the connection pattern 16. In an embodiment, holes H may be sufficiently deep to fully pass through the connection pattern 16 and extend down to the substrate 10. In another embodiment, the holes H may not fully pass through the connection pattern 16.

In addition, outer walls of the semiconductor patterns 13 may be surrounded by dielectric multi-layers 14. However, since the semiconductor patterns 13 are connected to the connection pattern 16, the dielectric multi-layers 14 may be formed to surround sidewalls of the semiconductor patterns 13 passing through the stacked structure ST. However, the dielectric multi-layers 14 may not be interposed between the semiconductor patterns 13 and the connection pattern 16 so that the semiconductor patterns 13 are in direct contact with and electrically connected to the connection pattern 16.

The dielectric multi-layers 14 may be a gate insulating layer of the select transistor or memory layers of the memory cells. For example, each of the dielectric multi-layers 14 may include at least one of a charge-blocking layer, a data storage layer, and a tunnel insulating layer. The data storage layer may include nitride, silicon, nano-dot material, phase change material, and the like. In addition, a C-shaped charge-blocking layer 18 surrounding each of the second conductive layers 11 may further be formed.

The connection pattern 16 may be located in the first conductive layer 19, and directly contact the lower portions of the semiconductor patterns 13, the first conductive layer 19, and the substrate 10. The connection pattern 16 may include a first portion 16A surrounding lower sidewalls and bottom surface of the semiconductor patterns 13, and a second portion 16B connecting two neighboring semiconductor patterns 13 arranged in the first direction I-I' or the second direction II-II'.

A slit SL is disposed between the semiconductor patterns 13 neighboring in the first direction I-I', and passes through the stacked structure ST, the first conductive layer 19, and the connection pattern 16 to vertically extend to substrate 10. In an embodiment, when the slit SL fully passes through the second portion 16B of the connection pattern 16, two neighboring connection patterns 16 arranged in the first direction I-I' may be separated from each other by a slit insulating layer 17. The connection pattern 16 may have a line shape extending in the second direction II-II'. Accordingly, the second source layer S2, which may include the connection pattern 16, is shared by two or more neighboring vertical memory strings arranged in the second direction II-II'. The second source layers S2 coupled to the two neighboring vertical memory strings arranged in the first direction I-I' are separated from each other.

Although not shown in FIGS. 1A and 18B, a protection layer may be formed on the connection pattern 16. The protection layer may be in contact with an upper surface of the connection pattern 16, have the same shape as the connection pattern 16, and include a different type of material from the connection pattern 16.

Figure 2A:
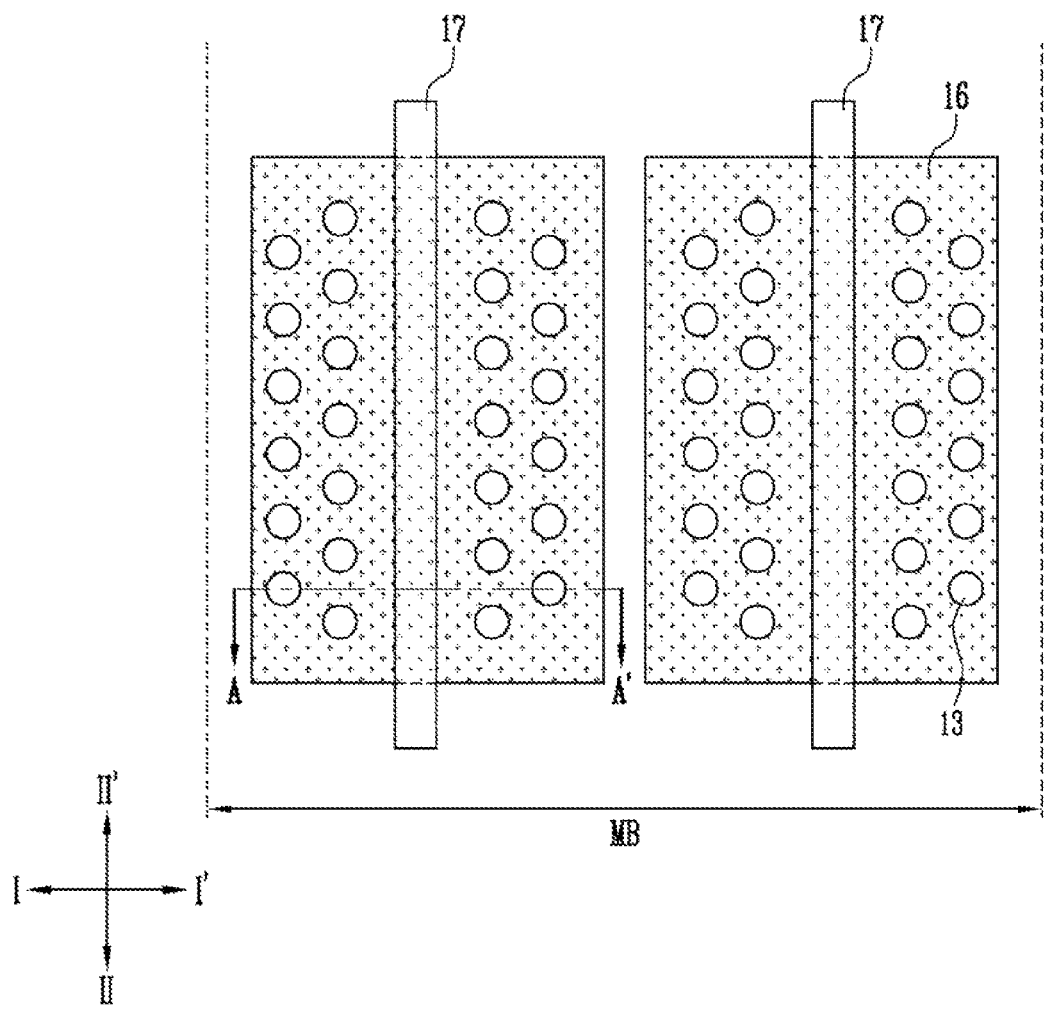
FIG. 2A is a layout of a semiconductor device according to an embodiment.
Figure 2B:
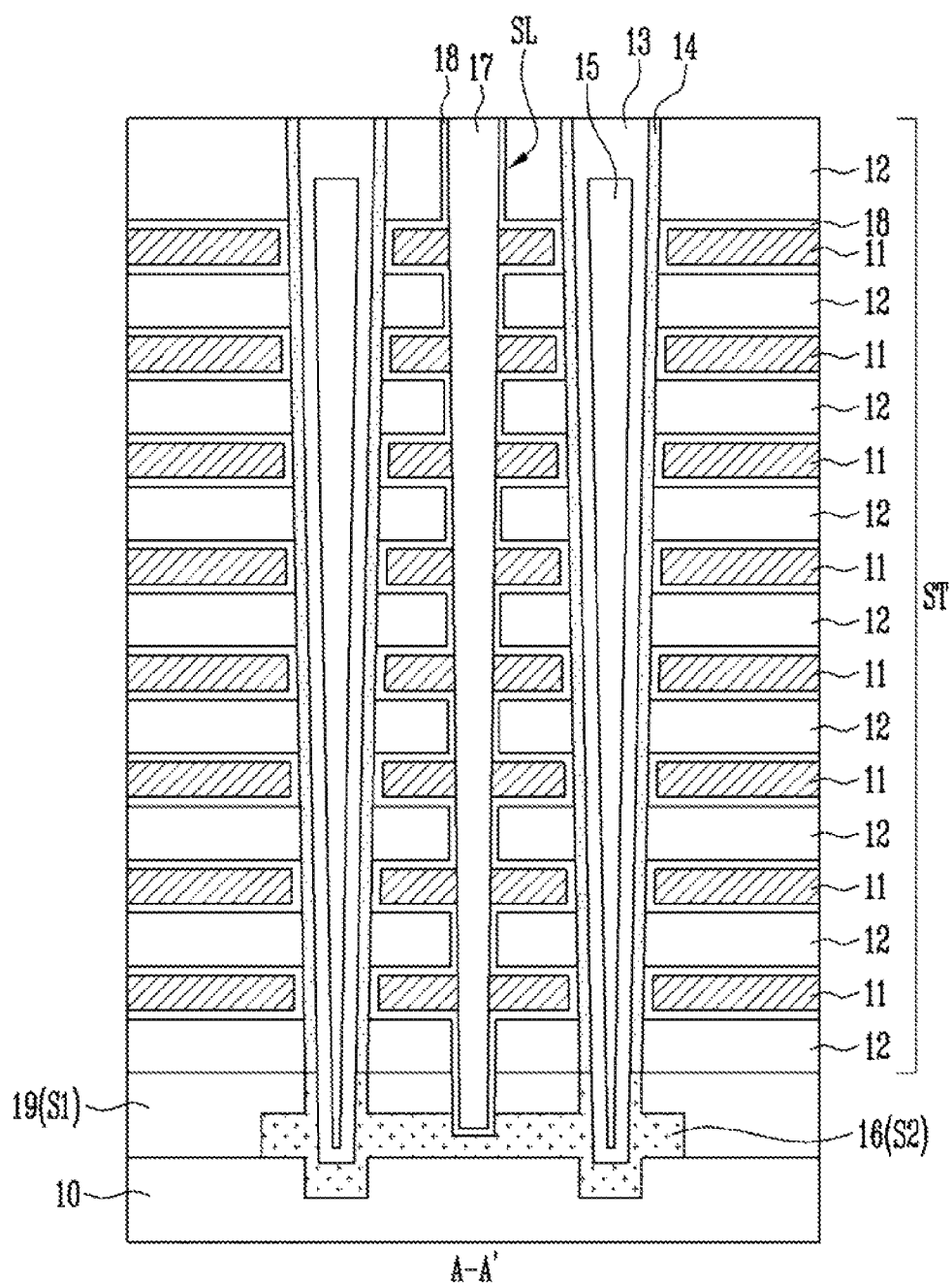
FIG. 2B is a cross-sectional view taken along line A-A' of FIG. 2A.

FIGS. 2A and 2B illustrate a semiconductor device according to an embodiment. FIG. 2A is a layout, and FIG. 2B is a cross-sectional view taken along line A-A' of FIG. 2A. Hereinafter, a duplicated description of the above content will be omitted.

Referring to FIGS. 2A and 2B, the slit insulating layer 17 may not fully pass through the connection pattern 16. In this case, the second source layer S2 may be shared by two neighboring vertical memory strings arranged in the first direction I-I'. The slit SL may be in contact with the second source layer S2.

Figure 3:
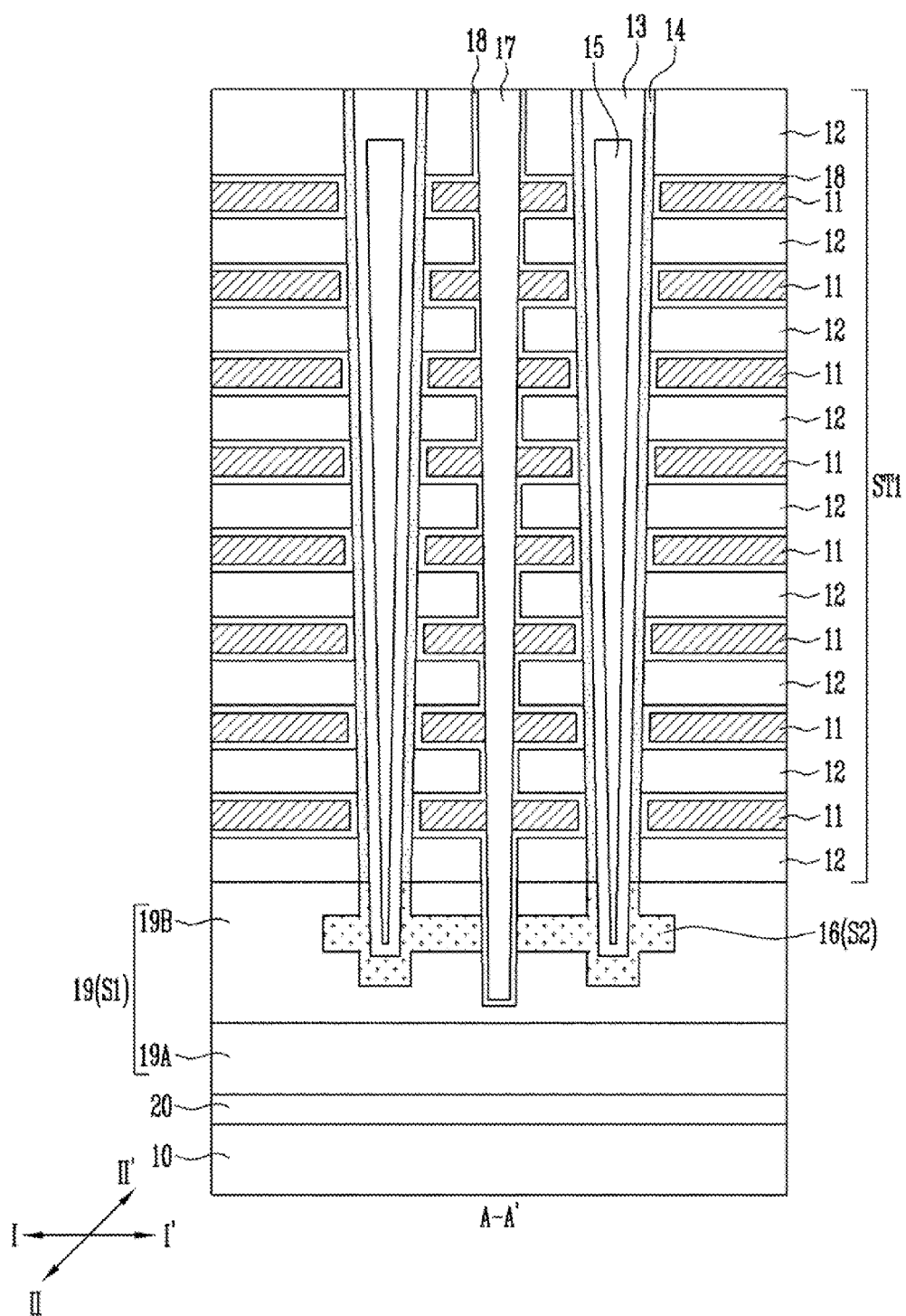
FIG. 3 is a cross-sectional view of a semiconductor device according to an embodiment.

FIG. 3 is a cross-sectional view of a semiconductor device according to an embodiment. Referring to FIG. 3, the first conductive layer 19 is a stacked layer, and a dielectric layer 20 may be interposed between the first conductive layer 19 and the substrate 10. For example, the first conductive layer 19 includes a metal layer 19A and a polysilicon layer 19B.

Here, since the slit insulating layer 17 fully passes through the connection pattern 16, the connection pattern 16 may have the same layout as shown in FIG. 1A. However, since the two neighboring connection patterns 16 arranged in the first direction I-I' are connected to each other by a polysilicon layer 19B and a metal layer 19A, the first and second source layers S1 and S2 may be shared by two vertical memory strings arranged in the first direction I-I'.

In another embodiment, the slit insulating layer 17 may not fully pass through the connection pattern 16. In this case, the connection pattern 16 may have the same layout as shown in FIG. 1B. Additionally, the first and second source layers S1 and S2 may be shared with two neighboring vertical memory strings arranged in the first direction I-I'. In another embodiment, the slit insulating layer 17 may fully pass through the polysilicon layer 19B and extend down to the metal layer 19A.

Figure 4A:
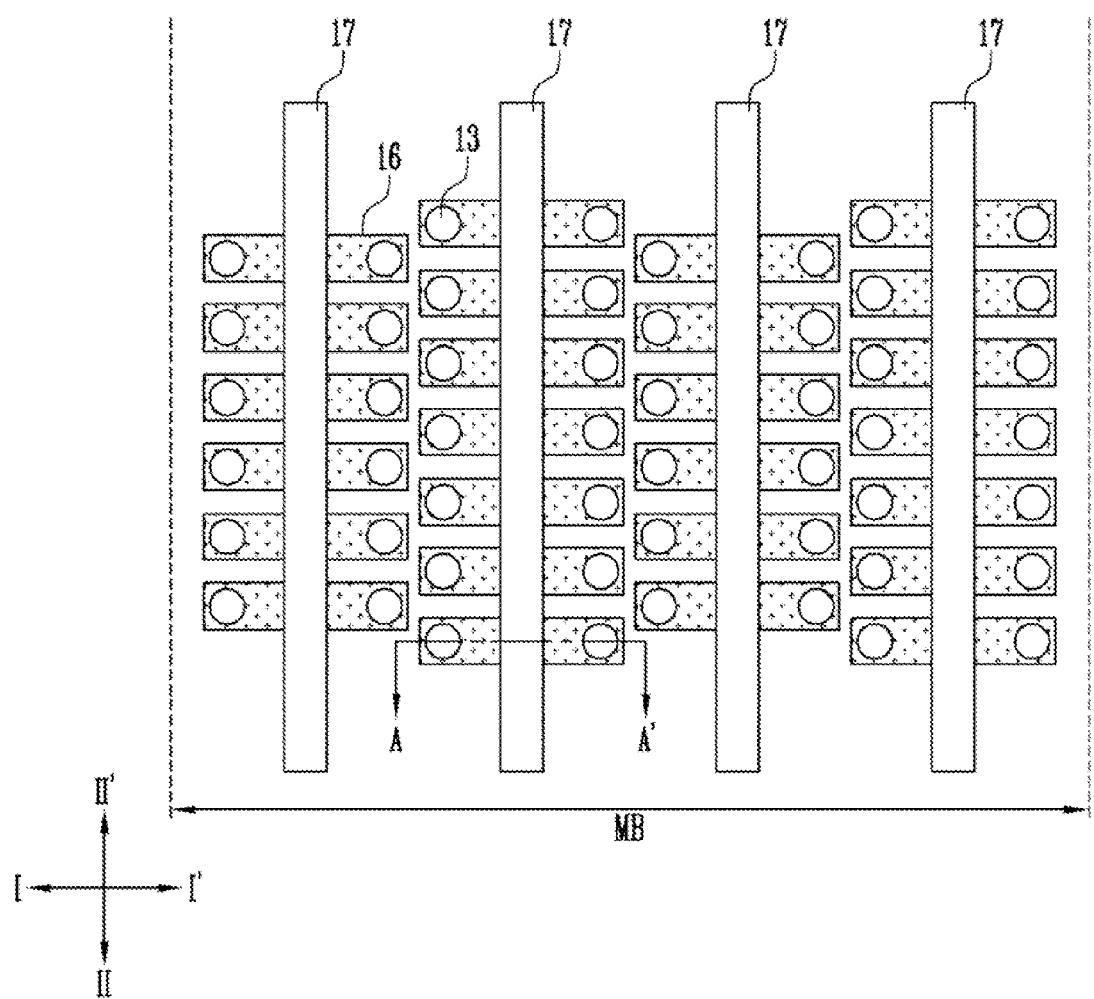
FIG. 4A is a layout of a semiconductor device according to an embodiment.
Figure 4B:
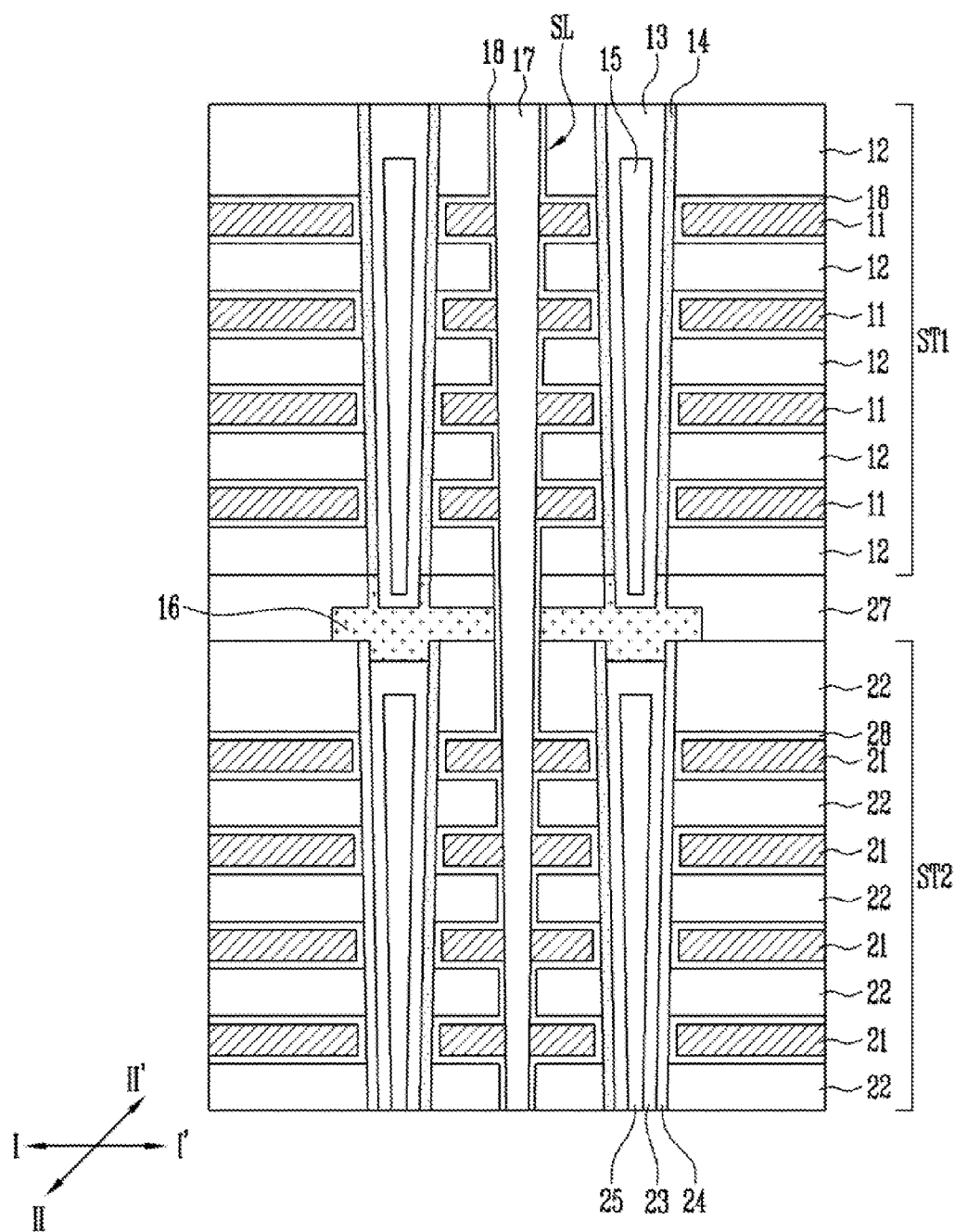
FIG. 4B is a cross-sectional view taken along line A-A' of FIG. 4A.

FIGS. 4A and 4B illustrate a structure of a semiconductor device according to an embodiment. FIG. 4A is a layout, and FIG. 4B is a cross-sectional view taken along line A-A' of FIG. 4A.

As illustrated in FIGS. 4A and 4B, the semiconductor device may include a second stacked structure ST2, a first stacked structure ST1 disposed on the second stacked structure ST2, and a connection pattern 16 disposed between the first stacked structure ST1 and the second stacked structure ST2.

The first stacked structure ST1 include second conductive layers 11 and first insulating layers 12 which are alternately stacked, first semiconductor patterns 13 passing through the first stacked structure ST1, and first multilayer dielectric layers 14 surrounding the first semiconductor patterns 13. A detailed structure of the first stacked structure ST1 may be similar to the structure shown in FIG. 1B.

The second stacked structure ST2 may have a similar structure to the first stacked structure ST1. For example, the second stacked structure ST2 may include third conductive layers 21 and second insulating layers 22 which are alternately stacked, second semiconductor patterns 23 passing through the second stacked structure ST2, and second dielectric multi-layers 24 surrounding the second semiconductor patterns 23. Here, the second semiconductor patterns 23 may be filled with insulating layers 25. A charge-blocking layer 28 surrounding each of the third conductive layers 21 may be formed.

The connection pattern 16 may be interposed between the first stacked structure ST1 and the second stacked structure ST2, and connect each of the upper first semiconductor patterns 13 to each of the lower second semiconductor patterns 23. Here, since the connection pattern 16 is formed as a part of a channel layer, the connection pattern 16 may have an island shape so as to connect one of the first semiconductor patterns 13 to one of the second semiconductor patterns 23.

The slit SL may pass through the first stacked structure ST1, an insulating layer 27, the connection pattern 16, and the second stacked structure ST2. The connection pattern 16 and the insulating layer 27 surrounding the connection pattern 16 may be disposed between the first stacked structure ST1 and the second stacked structure ST2.

For reference, although not shown in FIGS. 4A and 4B, a connection pattern such as a source layer, may be formed under the second stacked structure ST2. Here, the connection pattern such as a source layer, may be connected to lower portions of the second semiconductor patterns 23, and may have a similar structure to those shown in FIGS. 1B, 2B, and 3.

Figure 5A:
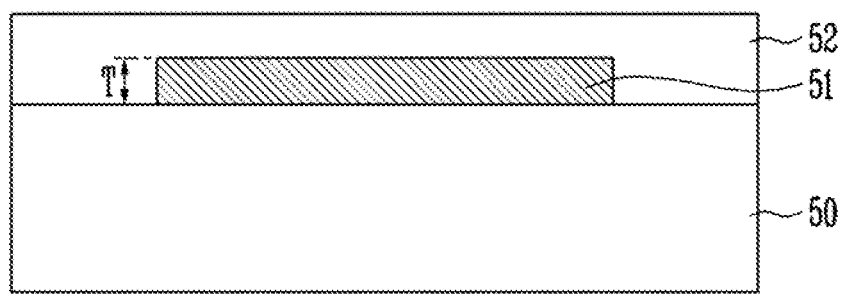
FIGS. 5A to 5G are cross-sectional views for describing a method of manufacturing a semiconductor device according to an embodiment.

FIGS. 5A to 5G are cross-sectional views for describing a method of manufacturing a semiconductor device according to an embodiment. In addition, FIGS. 6A to 6D are enlarged views of the area A shown in FIGS. 5D and 5E. As illustrated in FIG. 5A, after forming a sacrificial pattern 51 on a substrate 50, a first conductive layer 52 is formed on the substrate 50 on which the sacrificial pattern 51 is formed. The sacrificial pattern 51 defines a region in which a connection pattern is to be formed in a subsequent process. The shape of the sacrificial pattern 51 may vary depending on a layout of the connection pattern. For example, when the connection pattern is formed according to the layouts shown in FIGS. 1A and 2A, two plate-type sacrificial patterns 51 may be formed in one memory block MB. Alternatively, when the connection pattern is formed according to the layout shown in FIG. 4A, a plurality of island-type sacrificial patterns 51 may be formed.

The thickness T of the sacrificial pattern 51 may be determined in consideration of thicknesses of dielectric multi-layers and semiconductor patterns to be formed in a subsequent process. For example, when the dielectric multi-layers includes a charge-blocking layer, a data storage layer, and a tunnel insulating layer, the sacrificial pattern 51 may be more than twice as thick as the thickness of the charge-blocking layer, and less than twice as thin as the sum of the thickness of the dielectric multi-layers and the thickness of the semiconductor patterns. Alternatively, the sacrificial pattern 51 may be twice as thick as the thickness of the tunnel insulating layer, and twice as thin as the sum of the thickness of the dielectric multi-layers and the thickness of the semiconductor patterns.

The sacrificial pattern 51 may include titanium nitride (TiN), nitride, oxide, metal, and the like, and the first conductive layer 52 may include polysilicon. For reference, a dielectric layer and a metal layer may be formed on the substrate 50, and the sacrificial pattern 51 may be formed on the metal layer. In addition, a dielectric layer may be formed instead of the first conductive layer 52.

Figure 5B:
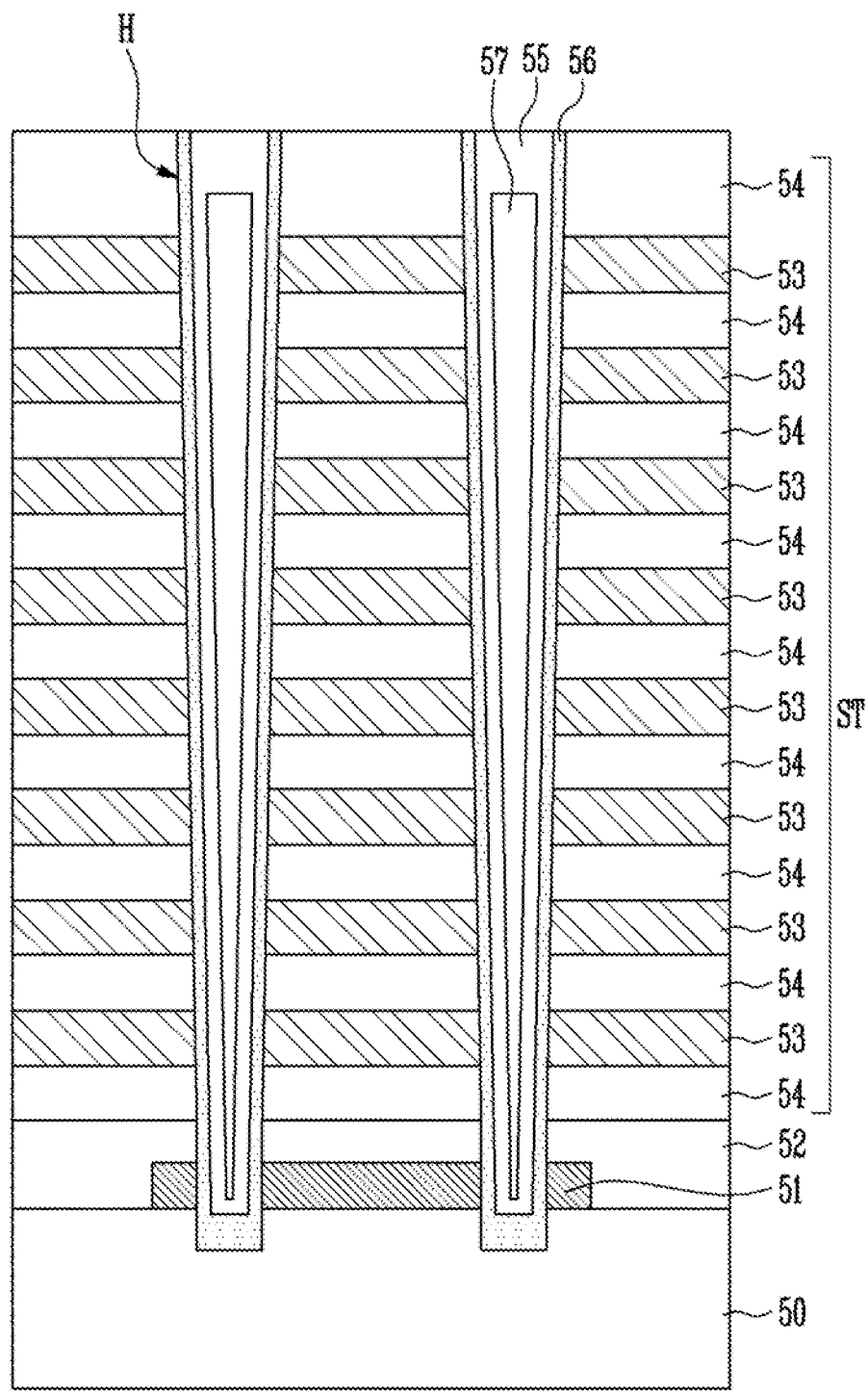

As illustrated in FIG. 5B, a stacked structure ST in which first material layers 53 and second material layers 54 are alternately stacked on the first conductive layer 52 may be formed. The first material layers 53 may serve as gate electrodes of a select transistor, memory cells, and the like. The second material layers 54 may serve as an insulating layer and electrically insulate the stacked first conductive layer 52 serving as the gate electrodes.

The first material layers 53 may include a material having high etch selectivity with respect to the second material layers 54. For example, the first material layers 53 may serve as a sacrificial layer and include nitride. The second material layers 54 may serve as an insulating layer and include oxide. In another embodiment, the first material layers 53 may include a conductive layer such as doped polysilicon, doped amorphous silicon, and the like. The second material layers 54 may serve as a sacrificial layer and include undoped polysilicon, undoped amorphous silicon, and the like. In still another embodiment, the first material layers 53 may be a conductive layer and include doped polysilicon, doped amorphous silicon, and the like. The second material layers 54 may be an insulating layer such as an oxide. In another embodiment, the first material layers 53 serves as a sacrificial layer, and the second material layers 54 serves as an insulating layer.

Holes H passing through the stacked structure ST, the first conductive layer 52, and the sacrificial pattern 51 may be formed. Here, the holes H may partially penetrate the sacrificial pattern 51, or fully pass through the sacrificial pattern 51 to extend down to the substrate 50.

Next, semiconductor patterns 55 and dielectric multi-layers 56 surrounding the semiconductor patterns 55 may be formed in the holes H. Here, the semiconductor patterns 55 may fully fill the holes H. In another embodiment, the semiconductor patterns 55 may partially fill the holes H, leaving the center portions of the holes H empty or open. The empty or open center portions may be filled by an insulating layer 57.

Figure 5C:
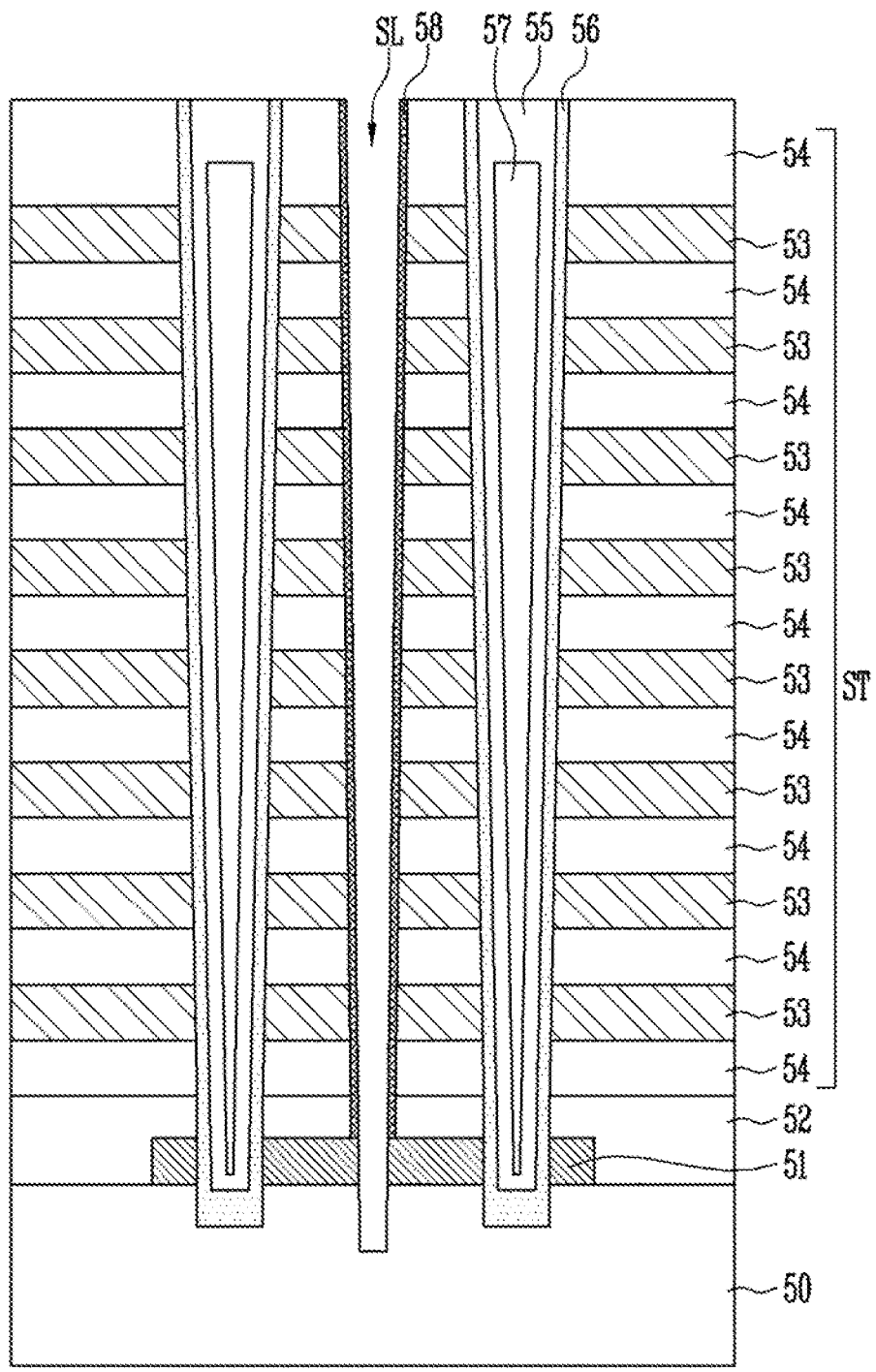

As illustrated in FIG. 5C, a slit SL may be formed to pass through the stacked structure ST and the first conductive layer 52 and expose the sacrificial pattern 51. Here, the slit SL may penetrate the sacrificial pattern 51.

Next, a spacer 58 may be formed on an inner sidewall of the slit SL. For example, a material layer for a spacer is formed along an inner surface of the slit SL, and then the material layer for the spacer formed on a bottom surface of the slit SL is etched using a blanket etch process. Thus, a spacer 58 may be formed on the inner sidewall of the slit SL. The spacer 58 may include material having etch selectivity with respect to the sacrificial pattern 51. For example, the spacer 58 may include polysilicon, titanium nitride, nitride, oxide, metal, and the like. During the blanket etch process, the sacrificial pattern 51 disposed on a lower portion of the slit SL may be etched, and thus the slit SL may downwardly extend. That is, the slit SL may fully pass through the sacrificial pattern 51 and extend to the substrate 50.

Figure 5D:
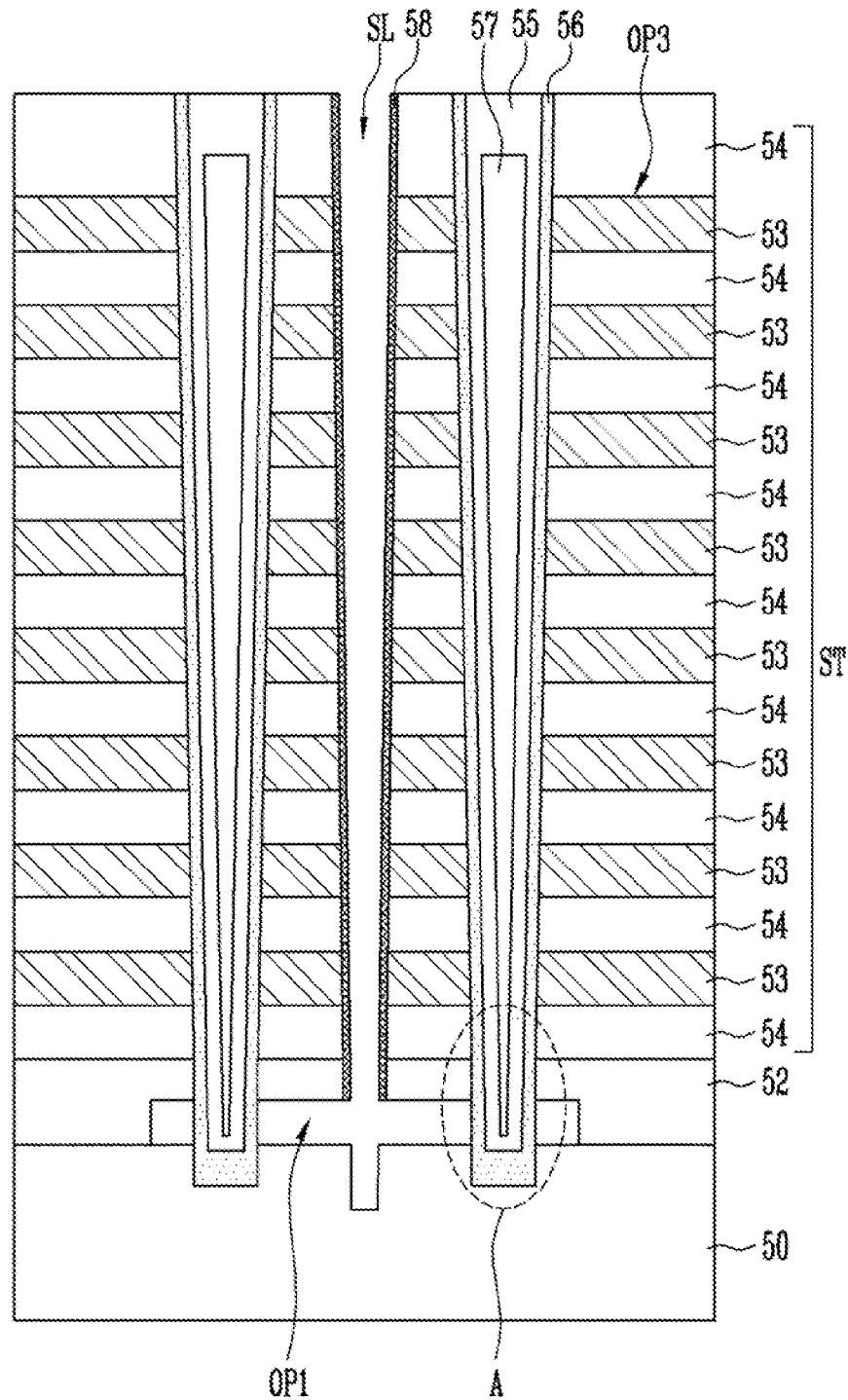
Figure 6A:
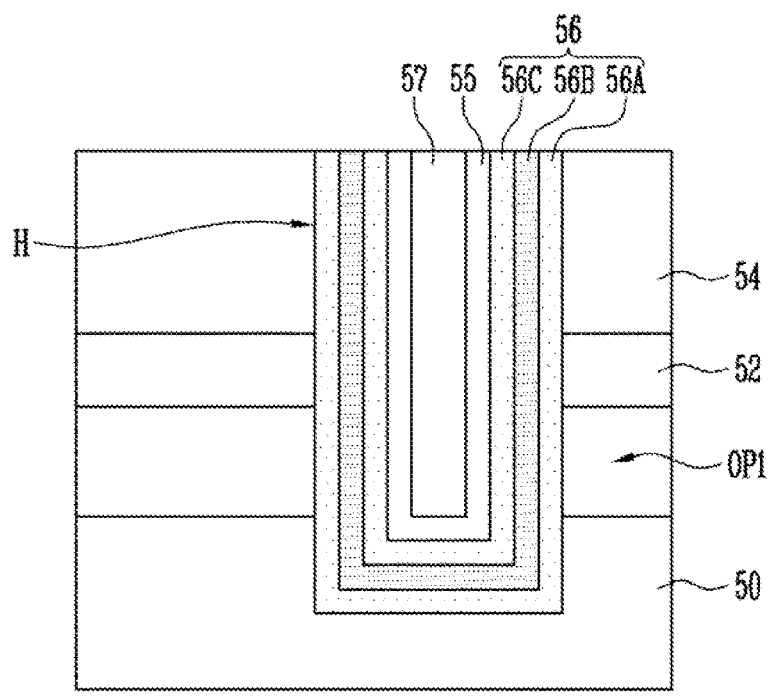
FIGS. 6A to 6D are enlarged views in which the area A shown in FIGS. 5D and 5E, is enlarged.

As illustrated in FIG. 5D, the sacrificial pattern 51 is removed through the slit SL to form a first opening OP1. Referring to FIG. 6A, which is an enlarged view of the area A of FIG. 5D, the dielectric multi-layers 56 formed in the holes H may be exposed through the first opening OP1. Furthermore, the dielectric multi-layers 56 may include a charge-blocking layer 56A, a data storage layer 56B, and a tunnel insulating layer 56C, and the charge-blocking layer 56A may be exposed by the opening OP1.

Figure 5E:
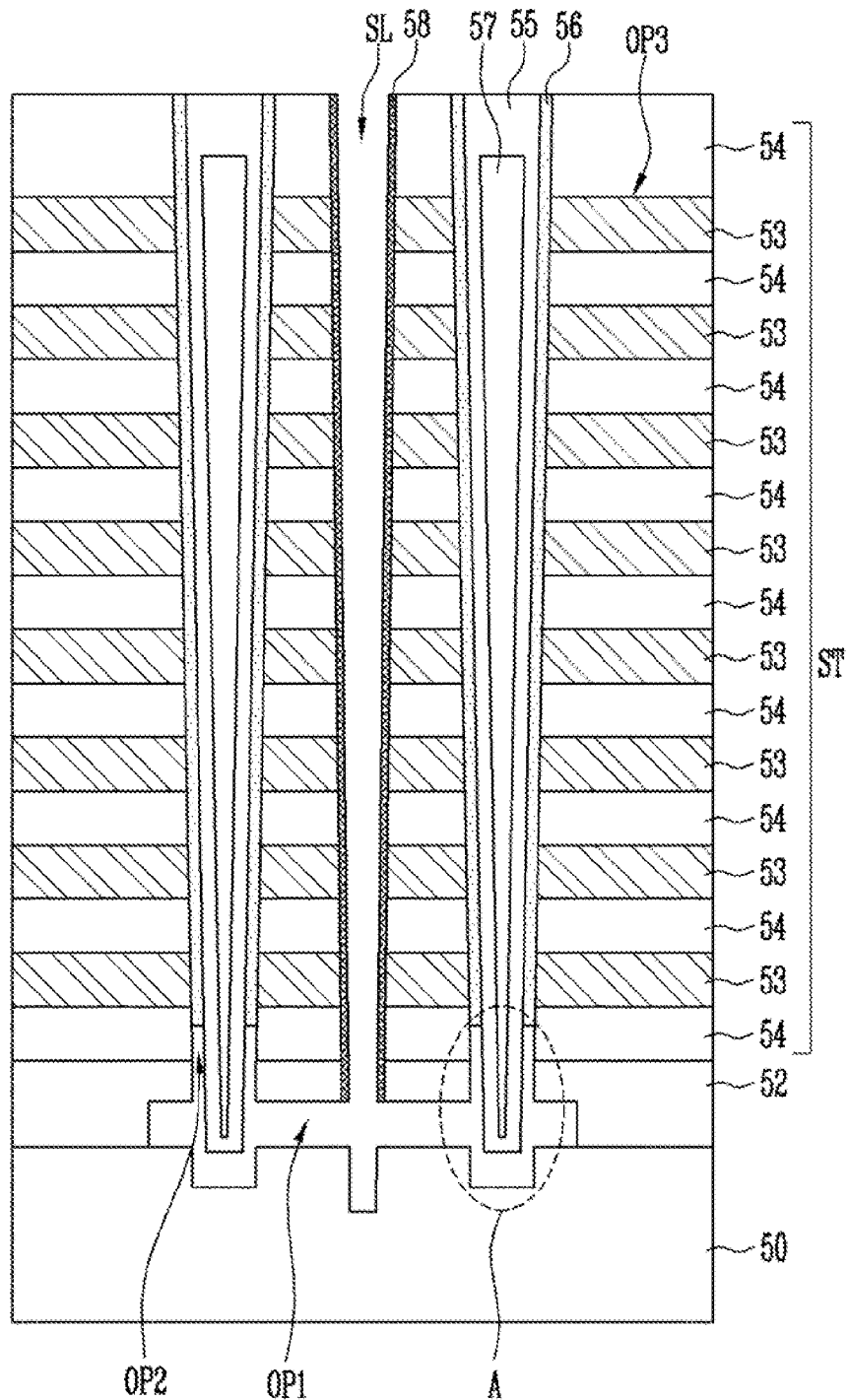
Figure 6B:
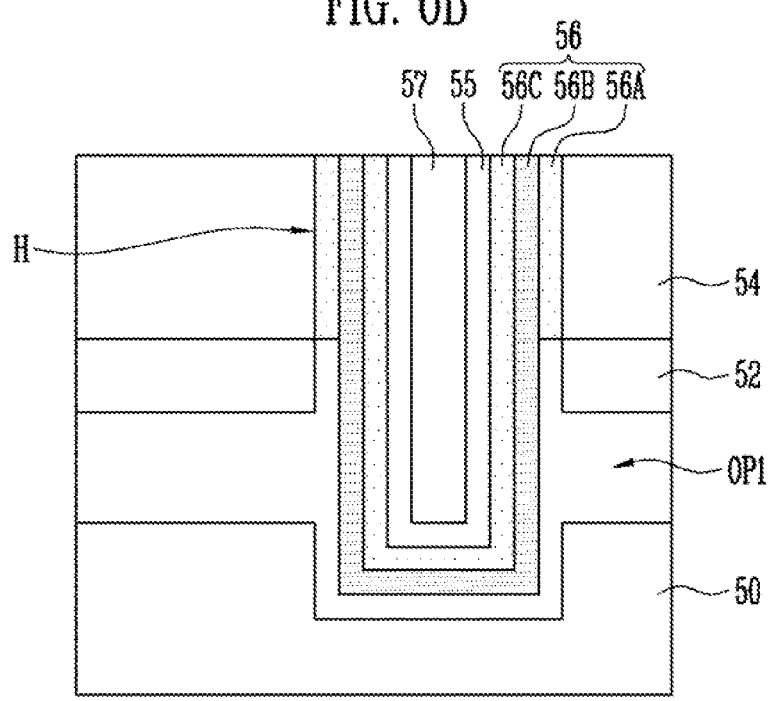
Figure 6C:
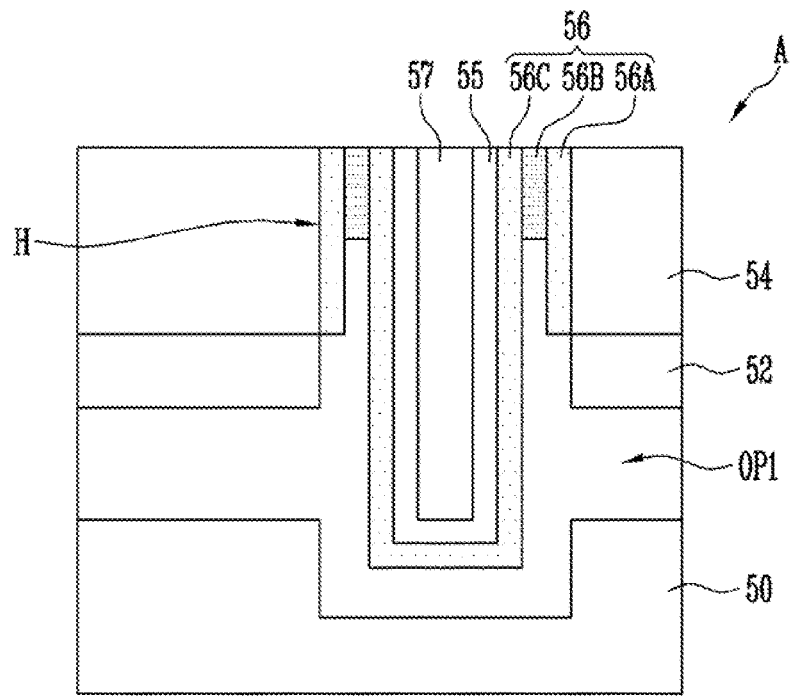
Figure 6D:
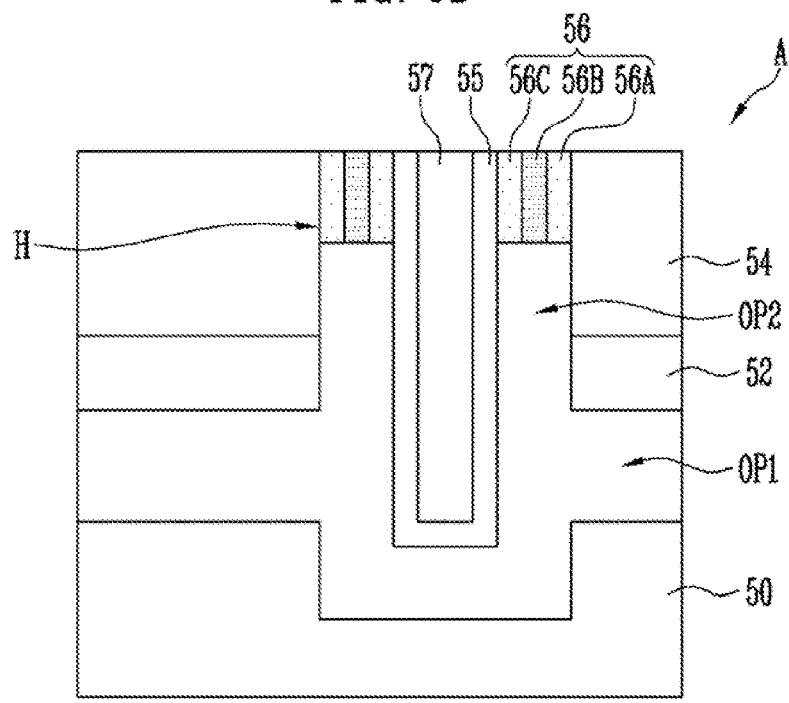

As illustrated in FIG. 5E, the dielectric multi-layers 56 exposed by the first opening OP1 may be partially removed to form a second opening OP2. Thus, the semiconductor patterns 55 may be exposed by the second opening OP2. FIG. 6B to 6D are enlarged views of the area A of FIG. 5E, where a process of removing the dielectric multi-layers 56 are illustrated step by step. First, referring to FIG. 6B, the charge-blocking layer 56A may be selectively etched through the first opening OP1 to expose the data storage layer 56B. Then, the charge-blocking layer 56A may be removed in the direction perpendicular to the direction in which the first opening OP1 extends. The charge-blocking layer 56A formed in the substrate 50 may be completely or partially removed. Next, as illustrated in FIG. 6C, the exposed data storage layer 56B may be partially removed. Since the data storage layer 56B is selectively removed through the first opening OP1, the removal amount of the data storage layer 56B may be easily controlled, and the second opening OP2 is formed. Next, the charge-blocking layer 56A and the tunnel insulating layer 56C exposed to the second opening OP2 upon removing the data storage layer 56B may be selectively removed. Thus, the dielectric multi-layers 56 formed on lower portions of the holes H are removed to form the second opening OP2, and lower portions of the semiconductor patterns 55 may be exposed through the first and second openings OP1 and OP2.

Figure 5F:
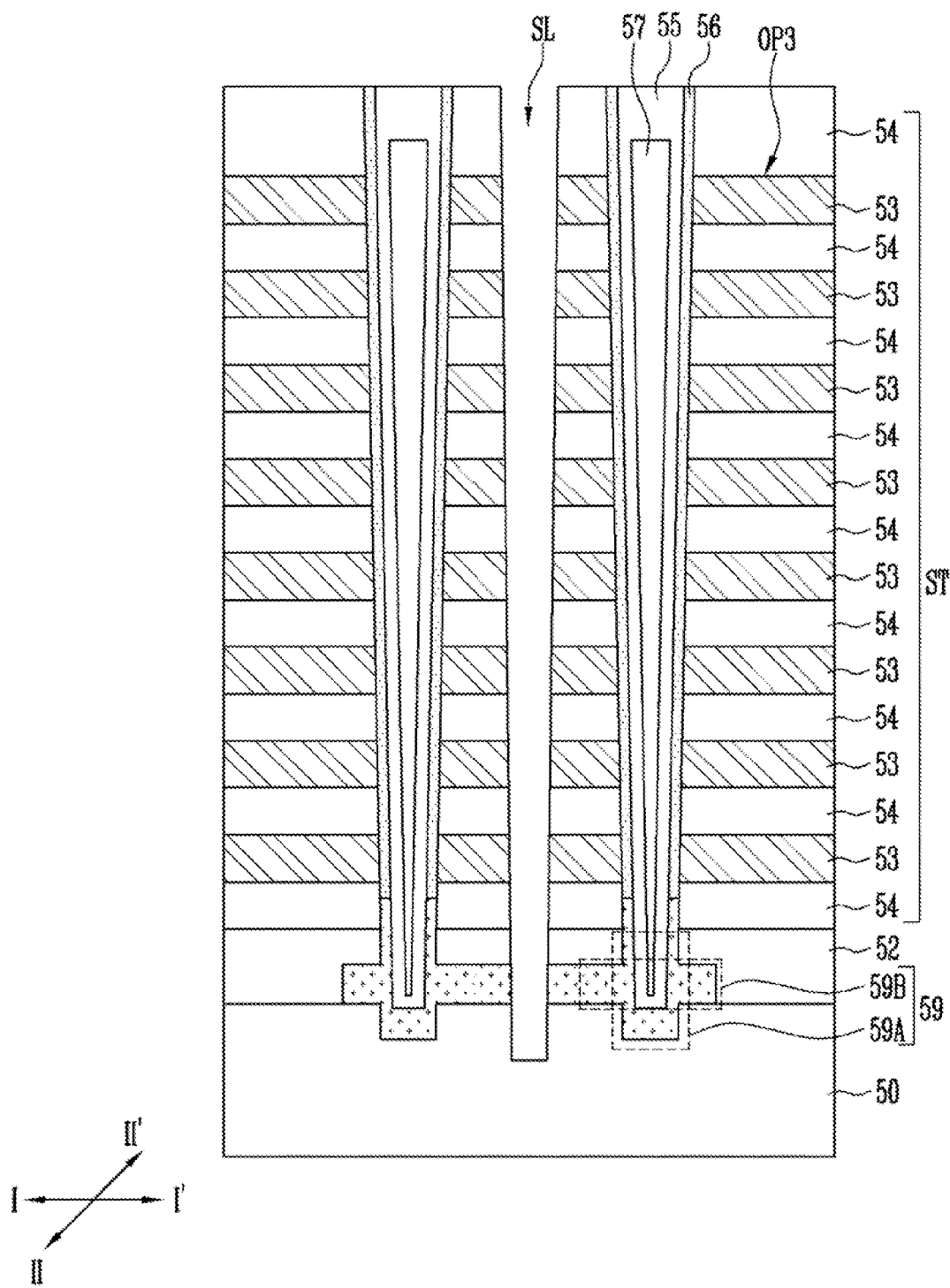

As illustrated in FIG. 5F, a connection pattern 59 may be formed in the first and second openings OP1 and OP2. The connection pattern 59 includes a first portion 59A formed in the second opening OP2 to surround the lower portions of the semiconductor patterns 55, and a second portion 59B formed in the first opening OP1. In addition, the connection pattern 59 may be in direct contact with the lower portions of the semiconductor patterns 55, the first conductive layer 52, and the substrate 50.

For example, after the spacer 58 is removed, the connection pattern 59 may be grown using a selective growth method. In this case, a polysilicon layer is grown from the semiconductor patterns 55, first conductive layer 52, and substrate 50 exposed through the first and second openings OP1 and OP2 to form the connection pattern 59. Furthermore, the connection pattern 59 may be an N+ polysilicon layer.

The connection pattern 59 may be formed to fill the lower portion of the slit SL, and the connection pattern 59 filling the lower portion of the slit SL may remain or be removed. When the connection pattern 59 filling the lower portion of the slit SL remains, the neighboring semiconductor patterns 55 arranged in the first direction I-I' may be connected by the connection pattern 59, resulting in a semiconductor device having the layout of FIG. 2B. When the connection pattern 59 filling the lower portion of the slit SL is removed, the neighboring connection pattern 59 of the semiconductor patterns 55 arranged in the first direction I-I' may be separated from each other, resulting in a semiconductor device having the layout of FIG. 1A.

Figure 5G:
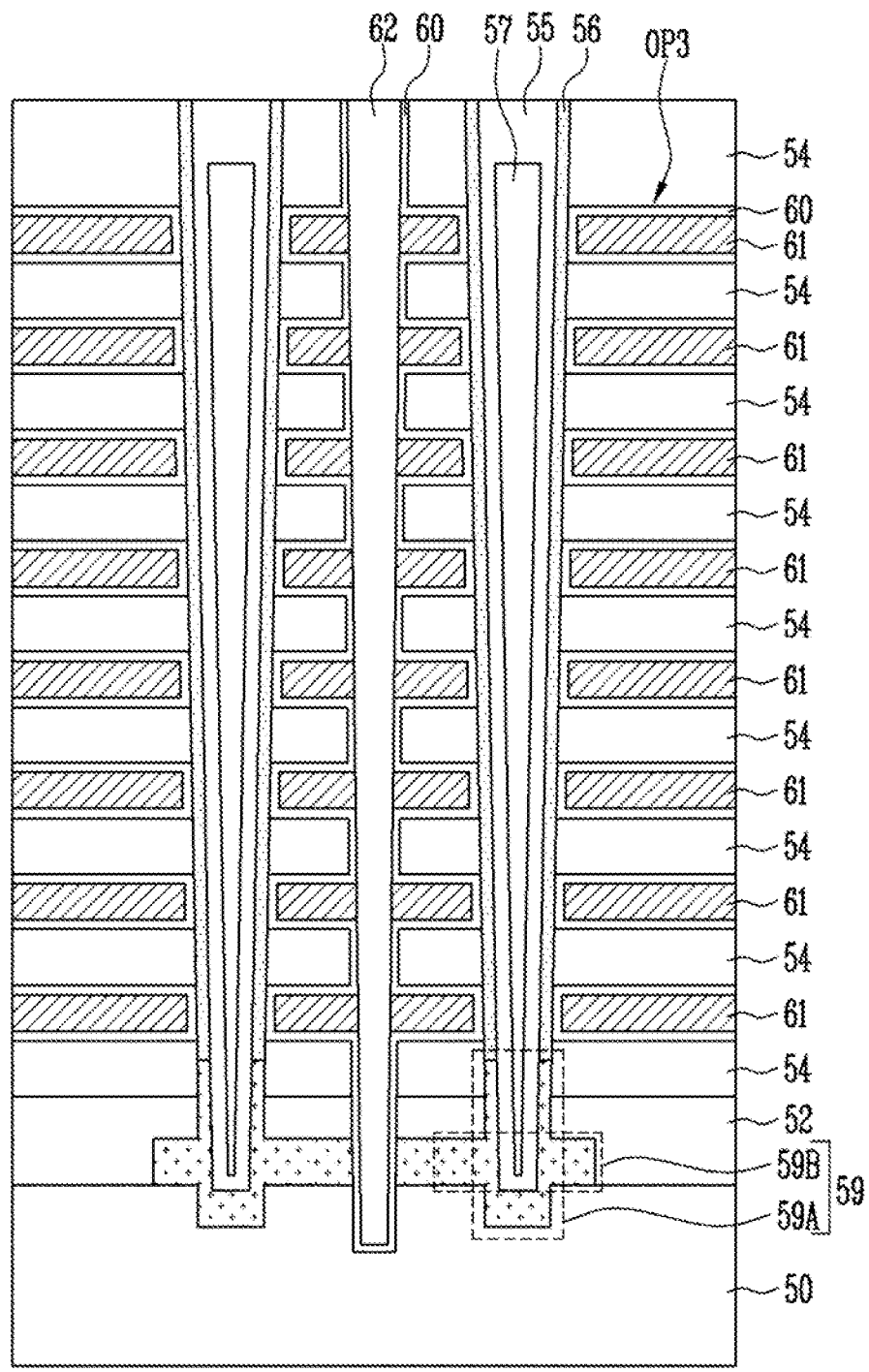

In FIG. 5G, the first material layers 53 exposed through the slit SL may be removed to form third openings OP3. Next, conductive layers 61 may be formed in the third openings OP3 through the slit SL shown in FIG. 5F. Before the conductive layers 61 are formed, charge-blocking layers 60 may be additionally formed. Next, an insulating layer 62 may be formed in the slit SL.

For reference, the above-described processes may be modified depending on materials forming the first and second material layers 53 and 54. For example, when the first material layer 53 is a conductive layer, and the second material layer 54 is a sacrificial layer, the third openings OP3 may be formed by removing the second material layers 54, and then the insulating layers may be formed in the third openings OP3. Alternatively, when the first material layer 53 is a conductive layer, and the second material layer 54 is an insulating layer, the process of forming the third openings OP3 may be omitted and a silicidation process of the first material layer 53 may be performed.

The semiconductor device described with reference to FIGS. 4A and 4B may be manufactured by applying the above-described manufacturing method. For example, a second stacked structure ST2 in which first material layers and second material layers are alternately stacked may be formed, and then holes may be formed. Next, second dielectric multi-layers 24 and second semiconductor patterns 23 may be formed in the holes. When the second semiconductor patterns 23 have an open center portion, an insulating layer 25 may be formed in the second semiconductor patterns 23. Sacrificial patterns may be formed on the second semiconductor pattern 23. The subsequent processes are similar to the processes that have been described above with reference to FIGS. 5A to 5G. However, since the connection pattern 16 is used as a part of a channel layer connecting the first semiconductor patterns 13 to the second semiconductor patterns 23 in FIGS. 4A and 4B, the slit SL may be formed to fully pass through the connection pattern 16. For example, the slit SL may be formed to pass through the first stacked structure ST1, the connection pattern 16, and the second stacked structure ST2.

Figure 7A:
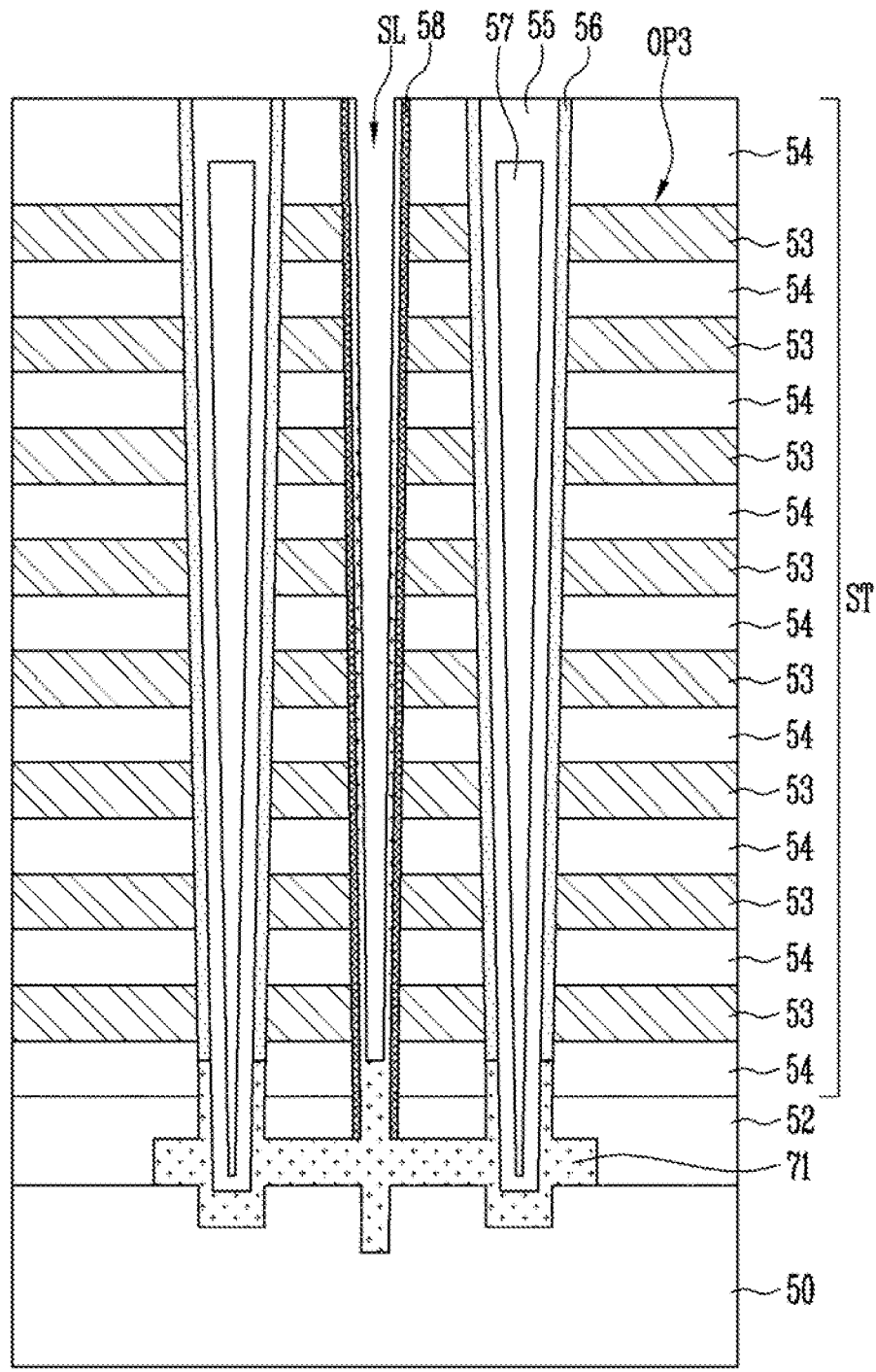

FIGS. 7A and 7B are cross-sectional views for describing a method of forming a connection pattern according to an embodiment. In particular, FIGS. 7A and 7B relate to an embodiment in which a connection pattern 71 is formed using a deposition method.

Referring to FIG. 7A, after performing the processes described with reference to FIGS. 5A to 5E, the material layer 71 for forming a connection pattern may be deposited. By using the deposition process, the material layer 71 for forming the connection pattern may be formed in the first and second openings OP1 and OP2 and the slit SL. Accordingly, the material layer 71 for forming the connection pattern may be deposited on the spacer 58 disposed in the slit SL, too.

Referring to FIG. 7B, the material layer 71 for forming the connection pattern formed in the slit SL may be removed. The spacer 58 is removed along with the material layer 71 for forming the connection pattern, and the first material layers 53 is exposed through the slit SL. Thus, a connection pattern 71A may be formed.

Figure 8:
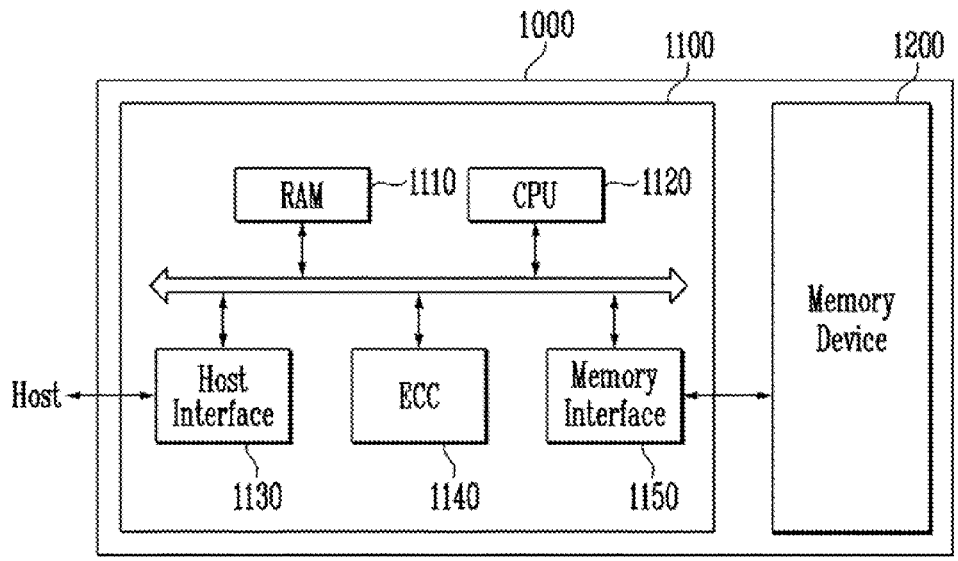
FIGS. 8 and 9 are block diagrams illustrating a configuration of a memory system according to an embodiment.

FIG. 8 is a block diagram illustrating a configuration of a memory system according to an embodiment.

As illustrated in FIG. 8, a memory system 1000 according to an embodiment includes a memory device 1200 and a controller 1100.

The memory device 1200 may be used to store various types of data information, such as text, graphic, and software codes. The memory device 1200 may be a nonvolatile memory device, and have a structure that has been described above with reference to FIGS. 1A to 7B. Since the structure of the memory device 1200 and the method of manufacturing thereof are the same as those in the above-described embodiments, detailed descriptions thereof will be omitted.

The controller 1100 may be connected to a host and the memory device 1200, and configured to access the memory device 1200 in response to a request from the host. For example, the controller 1100 may be configured to control read, write, erase, and perform background operations of the memory device 1200.

The controller 1100 may include a random access memory (RAM) 1110, a central processing unit (CPU) 1120, a host Interface 1130, an error correction code (ECC) circuit 1140, and a memory interface 1150.

The RAM 1110 may be used as an operational memory of the CPU 1120, a cache memory between the memory device 1200 and the host, or a buffer memory between the memory device 1200 and the host. In another embodiment, the RAM 1110 may be replaced by a static random access memory (SRAM), a read only memory (ROM), and the like.

The CPU 1120 may be configured to control the overall operation of the controller 1100. For example, the CPU 1120 may be configured to operate firmware such as a flash translation layer (FTL) stored in the RAM 1110.

The host interface 1130 may be configured to perform interfacing with the host. For example, the controller 1100 may communicate with the host through at least one of various interface protocols, such as a Universal Serial Bus (USB) protocol, a multimedia card (MMC) protocol, a peripheral component interconnection (PCI) protocol, a PCI-Express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect errors included in data, which is read from the memory device 1200, using an ECC and then correct the errors.

The memory interface 1150 may be configured to perform interfacing with the memory device 1200. For example, the memory interface 1150 may include a NAND interface or a NOR interface.

For reference, the controller 1100 may further include a buffer memory (not shown) for temporally storing data. The buffer memory may temporally store data transmitted to the outside through the host interface 1130 or data transmitted from the memory device 1200 through the memory interface 1150. In addition, the controller 1100 may further include a ROM storing code data for interfacing with the host.

Accordingly, since the memory system 1000 according to an embodiment includes the memory device 1200 having a high degree of integration and improved performance, the degree of integration and performance of the memory system 1000 may also be improved.

Figure 9:
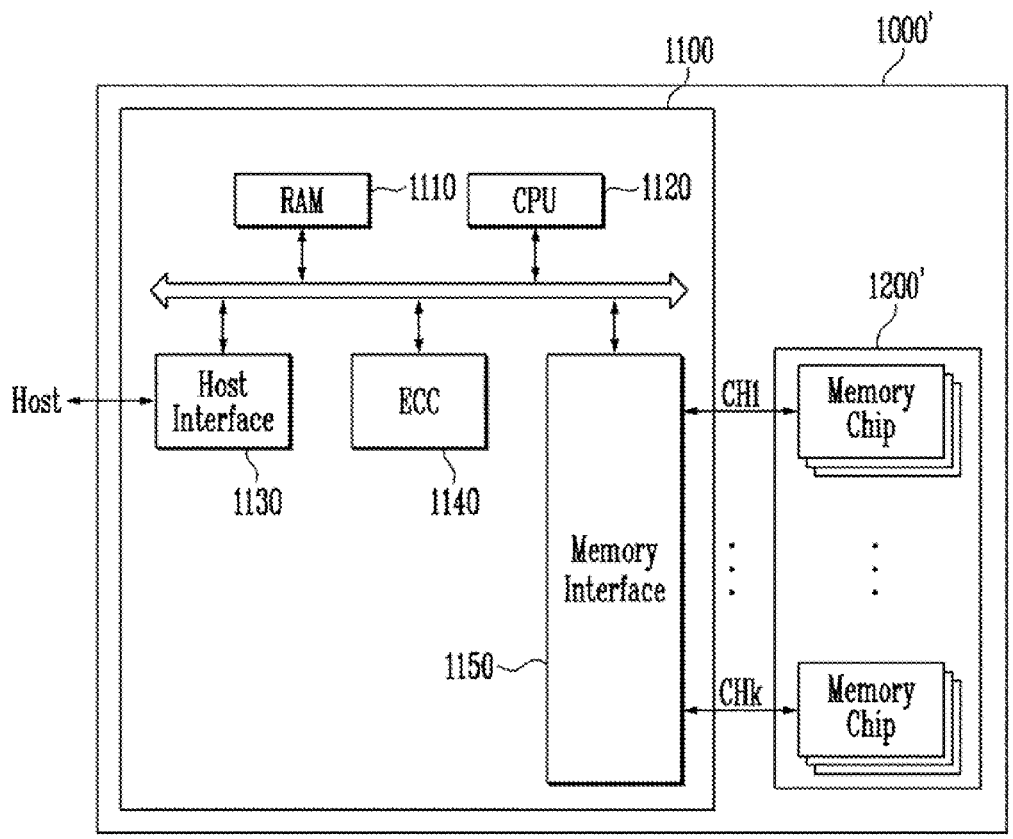

FIG. 9 is a block diagram illustrating a configuration of a memory system according to an embodiment. Hereinafter, a duplicated description of the above-described content will be omitted.

As illustrated in FIG. 9, a memory system 1000' according to an embodiment may include a memory device 1200' and a controller 1100. In addition, the controller 1100 may include a RAM 1110, a CPU 1120, a host interface 1130, an ECC circuit 1140, and a memory interface 1150.

The memory device 1200' may be a nonvolatile memory device, and include the memory string that has been described above with reference to FIGS. 1A to 7B. Since the structure of the memory device 1200' and the method of manufacturing thereof are the same as those in the above-described embodiments, detailed descriptions thereof will be omitted.

In addition, the memory device 1200' may be a multichip package having a plurality of memory chips. The plurality of memory chips may be divided into a plurality of groups, the plurality of groups may be configured to communicate with the controller 1100 through first to $k^{th}$ channels CH1 to CHk, where K is an integer. In addition, the memory chips belonging to one group may be configured to communicate with the controller 1100 through a common channel. The memory system 1000' may be modified in such a manner that one memory chip is connected to one channel.

Since the memory system 1000' according to the embodiment includes the memory device 1200' which has an improved degree of integration, has improved performance, and is easy to manufacture, the degree of integration and performance of the memory system 1000 may also be improved. In particular, by configuring the memory device 1200' as a multichip package, the memory system 1000' may have an increased data storage capacity and an improved driving speed.

Figures 10, 11:
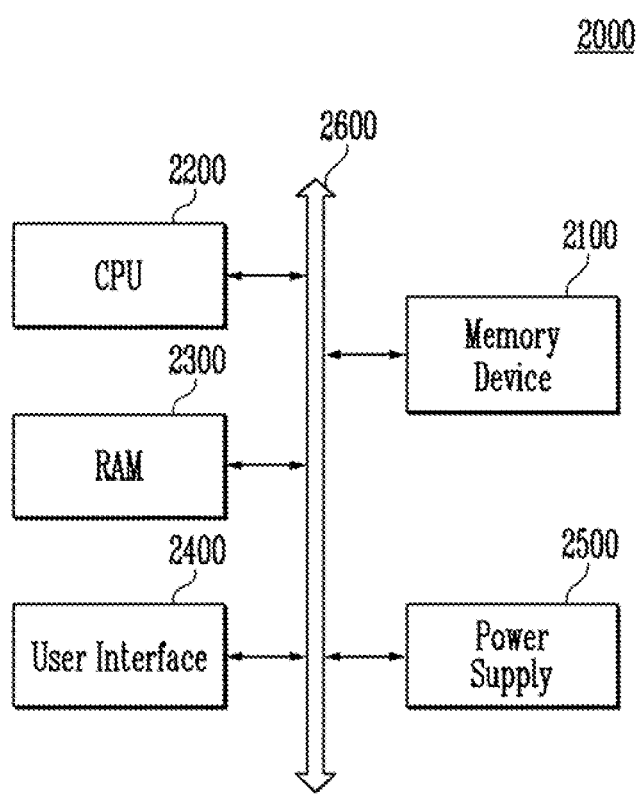
FIGS. 10 and 11 are block diagrams illustrating a configuration of a computing system according to an embodiment.

FIG. 10 is a block diagram illustrating a configuration of a computing system according to an embodiment. Hereinafter, a duplicated description of the above-described content will be omitted.

As illustrated in FIG. 10, a computing system 2000 according to an embodiment may include a memory device 2100, a CPU 2200, a RAM 2300, a user interface 2400, power supply 2500, and a system bus 2600.

The memory device 2100 may store data provided through the user interface 2400, data processed by the CPU 2200, and the like. In addition, the memory device 2100 may be electrically connected to the CPU 2200, the RAM 2300, the user interface 2400, and the power supply 2500 through the system bus 2600. For example, the memory device 2100 may be connected to the system bus 2600 through a controller (not shown), or directly connected to the system bus 2600. When the memory device 2100 is directly connected to the system bus 2600, the CPU 2200 and the RAM 2300 may function as the controller.

The memory device 2100 may be a nonvolatile memory, and may include the memory string that has been described above with reference to FIGS. 1A to 7B. Since the structure of the memory device 2100 and the method of manufacturing the same are the same as those in the above-described embodiments, detailed descriptions thereof will be omitted.

In addition, the memory device 2100 may be a multichip package including a plurality of memory chips as described with reference to FIG. 9.

The computing system 2000 having such a configuration may be a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation apparatus, a black box, a digital camera, a three-dimensional television, a digital audio recorder, a digital picture recorder, a digital video recorder, a digital audio recorder, a digital audio player, a digital picture recorder, a digital picture player, a digital video recorder, a digital video player, a wireless information transmitter-receiver, one of various electronic devices configuring a home network, one of various electronic devices configuring a computer network, one of various electronic devices configuring a telematics network, a radio-frequency identification (RFID) device, and the like.

Since the computing system 2000 according to an embodiment includes the memory device 2100, which has an improved degree of integration and improved performance and is easy to manufacture, the degree of integration and performance of the computing system 2000 may also be improved.

FIG. 11 is a block diagram illustrating a computing system according to an embodiment.

As illustrated in FIG. 11, a computing system 3000 according to an embodiment may include a software architecture including an operating system 3200, an application 3100, a file system 3300, and a translation layer 3400. In addition, the computing system 3000 may include a hardware architecture including a memory device 3500, and the like.

The operating system 3200 may be configured to manage a software resource and a hardware resource of the computing system 3000, and control a program operation of a CPU. The application 3100 may be a variety of application programs executed in the computing system 3000, that is, a utility operated by the operating system 3200.

The file system 3300 may refer to a logical structure for managing data and files existing in the computing system 3000, and for organizing data or files to be stored in the memory device 3500, etc. according to rules. The file system 3300 may be determined according to an operating system 3200 used in the computing system 3000. For example, when the operating system 3200 is a Windows series made by Microsoft Corporation, the file system 3300 may be a file allocation table (FAT), an NT file system (NTFS), etc. In addition, when the operating system 3200 is a UNIX/Linux series, the file system 3300 may be an extended (EXT) file system, a UNIX file system (UFS), or a journaling file system (JFS), etc.

Although the operating system 3200, the application 3100, and the file system 3300 are illustrated as separated blocks in FIG. 11, the application 3100 and the file system 3300 may be included in the operating system 3200.

The translation layer 3400 may translate an address to a form suitable for the memory device 3500 in response to a request from the file system 3300. For example, the translation layer 3400 translates a logic address generated by the file system 3300 to a physical address of the memory device 3500. Mapping information of the logic address and physical address may be stored in an address translation table. For example, the translation layer 3400 may be a flash translation layer (FTL), a universal flash storage link layer (ULL), etc.

The memory device 3500 may be a nonvolatile memory device, and may include the memory string that has been described above with reference to FIGS. 1A to 7B. Since a structure and a manufacturing method of the memory device 3500 is the same as those in the above-described embodiment, detailed descriptions will be omitted.

A computing system 3000 having such a structure may be divided into an operating system layer performed at a high level region, and a controller layer performed at a low level region. The application 3100, the operating system 3200, and the file system 3300 may belong to the operating system layer and may be driven by an operational memory of the computing system 3000. In addition, translation layer 3400 may belong to the operating system layer or the controller layer.

Since the computing system 3000 according to the embodiment includes the memory device 3500, which has an improved degree of integration and improved performance and is easy to manufacture, a data storage capacity and performance of the computing system 3000 may be improved.

According to the embodiment, manufacturing process may be simplified and characteristics of a semiconductor device may improve.

What is claimed is:

1. A method of manufacturing a semiconductor device; comprising:
    forming a sacrificial pattern;
    forming a first stacked structure over the sacrificial pattern, wherein first stacked structure includes first material layers and second material layers which are alternately stacked;
    forming first semiconductor patterns passing through the first stacked structure and dielectric multi-layers surrounding the first semiconductor patterns;
    forming a slit passing through the first stacked structure and exposing the sacrificial pattern;
    forming a spacer over an inner sidewall of the slit;
    forming a first opening by removing the sacrificial pattern through the slit;
    forming a second opening by partially removing the dielectric multi-layers through the first opening to expose lower portions of the first semiconductor patterns; and
    forming a connection pattern in the first and second openings, wherein the connection pattern is in contact with the first semiconductor patterns.

2. The method of claim 1, further comprising forming a first conductive layer for a source between the sacrificial pattern and the first stacked structure.

3. The method of claim 1, wherein the first semiconductor patterns have a depth to pass through the sacrificial pattern.

4. The method of claim 1, wherein the slit has a depth to pass through the sacrificial pattern.

5. The method of claim 1, wherein the spacer includes a material having higher etch selectivity than the sacrificial pattern.

6. The method of claim 1, wherein each of the dielectric multi-layers includes a tunnel insulating layer, a data storage layer, and a charge-blocking layer which sequentially surround each of the first semiconductor patterns.

7. The method of claim 6, wherein the forming of the second opening includes:
    partially removing the charge-blocking layer exposed through the first opening such that the data storage layer is exposed;
    partially removing the exposed data storage layer to expose the tunnel insulating layer; and
    partially removing the tunnel insulating layer exposed by removing the data storage layer.

8. The method of claim 7, wherein the sacrificial pattern is substantially more than twice as thick as the tunnel insulating layer, and less than twice as thin as the sum of a thickness of each of the dielectric multi-layers and a thickness of each of the first semiconductor patterns.

9. The method of claim 1, wherein the forming of the connection pattern comprises selectively growing a polysilicon layer from the first semiconductor patterns.

10. The method of claim 9, further comprising removing the spacer before forming the connection pattern.

11. The method of claim 1, wherein the forming of the connection pattern comprises:
    depositing a polysilicon layer in the slit and the first and second openings; and
    removing the polysilicon layer deposited in the slit.

12. The method of claim 1, wherein the connection pattern comprises:
    a first portion formed in the second opening to surround a lower sidewall of each of the first semiconductor patterns; and
    a second portion formed in the first opening.

13. The method of claim 1, wherein the first semiconductor patterns include channel layers, and
    wherein the connection pattern includes a source layer.

14. The method of claim 1, further comprising:
    forming third openings by removing the first material layers through the slit; and
    forming second conductive layers in the third openings.

15. The method of claim 14, further comprising:
    forming a charge-blocking layer in a liner pattern along the contour of the third openings before forming the second conductive layers.

16. The method of claim 14, wherein at least one lowermost second conductive layer among the second conductive layers is a gate electrode of a lower select transistor,
    wherein at least one uppermost second conductive layer among the second conductive layers is a gate electrode of an upper select transistor, and
    wherein the remaining second conductive layers are gate electrodes of memory cells.

17. The method of claim 1, further comprising:
    forming a second stacked structure including third material layers and fourth material layers which are alternately stacked before forming the sacrificial pattern; and
    forming second semiconductor patterns passing through the second stacked structure.

18. The method of claim 17, wherein the second semiconductor patterns are respectively connected to the first semiconductor patterns via the connection pattern.

19. The method of claim 18, wherein the first semiconductor patterns, the second semiconductor patterns, and the connection pattern include channel layers, respectively.

20. A method of manufacturing a semiconductor device; comprising:

forming a sacrificial pattern;

forming a first stacked structure over the sacrificial pattern, wherein first stacked structure includes first material layers and second material layers which are alternately stacked;

forming first and second semiconductor patterns each passing through the first stacked structure and each extending to the sacrificial pattern;

forming a slit passing through the first stacked structure between the first and the second semiconductor patterns and extending to the sacrificial pattern;

forming an opening by removing the sacrificial pattern to expose lower portions of the first and the second semiconductor patterns, wherein the opening extends from the first semiconductor pattern through the slit to the second semiconductor pattern; and forming a connection pattern in the opening.

21. The method of claim 20, further comprising:

forming a slit insulating layer in the slit, wherein the connection pattern extends from the first semiconductor pattern through under the slit insulating layer to the second semiconductor pattern.

22. The method of claim 20, further comprising:

forming a slit insulating layer in the slit, wherein the slit insulating layer passes through the connection pattern between the first and the second semiconductor patterns so that the connection pattern coupled to the first semiconductor pattern and the connection pattern coupled to the second semiconductor pattern are separated from each other by the slit insulating layer.

* * * * *